United States Patent
Li et al.

(10) Patent No.: US 8,506,849 B2
(45) Date of Patent: Aug. 13, 2013

(54) ADDITIVES AND MODIFIERS FOR SOLVENT- AND WATER-BASED METALLIC CONDUCTIVE INKS

(75) Inventors: Xueping Li, Austin, TX (US); Yunjun Li, Austin, TX (US); Peter B. Laxton, Austin, TX (US); David Max Roundhill, Austin, TX (US); Hidetoshi Arimura, Austin, TX (US)

(73) Assignees: Applied Nanotech Holdings, Inc., Austin, TX (US); Ishihara Chemical Co., Ltd., Hyogo (JP)

( * ) Notice: Subject to any disclaimer, the term of this patent is extended or adjusted under 35 U.S.C. 154(b) by 417 days.

(21) Appl. No.: 12/391,817

(22) Filed: Feb. 24, 2009

(65) Prior Publication Data
US 2009/0242854 A1  Oct. 1, 2009

Related U.S. Application Data

(60) Provisional application No. 61/034,087, filed on Mar. 5, 2008, provisional application No. 61/113,913, filed on Nov. 12, 2008.

(51) Int. Cl.
*H01B 1/02* (2006.01)

(52) U.S. Cl.
USPC ............ 252/512; 252/519.1; 106/31.13; 106/31.27; 427/58; 427/532

(58) Field of Classification Search
USPC ............ 252/519, 512, 519.1; 106/31.27, 106/31.13; 427/58, 532
See application file for complete search history.

(56) References Cited

U.S. PATENT DOCUMENTS

| | | | |
|---|---|---|---|
| 3,239,597 A | 3/1966 | Flynn | |
| 3,580,731 A | 5/1971 | Milewski et al. | |
| 3,796,598 A | 3/1974 | Gejyo et al. | |
| 3,950,605 A | 4/1976 | Hori et al. | |
| 4,093,466 A | 6/1978 | Davis | |
| 4,151,008 A | 4/1979 | Kirkpatrick | |
| 4,194,913 A | 3/1980 | Davis | |
| RE30,434 E | 11/1980 | Davis | |
| 4,234,631 A | 11/1980 | Davis | |
| 4,331,518 A | 5/1982 | Wilson | |

(Continued)

FOREIGN PATENT DOCUMENTS

| | | |
|---|---|---|
| CN | 1509206 A | 6/2004 |
| JP | 62124084 | 6/1987 |

(Continued)

OTHER PUBLICATIONS

MSDS: Fluorad by 3M (Mar. 2002). www.3m.com/paintsandcoatings.*

(Continued)

*Primary Examiner* — Khanh Tuan Nguyen
(74) *Attorney, Agent, or Firm* — Kelly Kordzik; Matheson Keys & Kordzik PLLC (57) ABSTRACT

A conductive ink includes metallic nanoparticles, a polymeric dispersant, and a solvent. The polymeric dispersant may be ionic, non-ionic, or any combination of ionic and non-ionic polymeric dispersants. The solvent may include water, an organic solvent, or any combination thereof. The conductive ink may include a stabilizing agent, an adhesion promoter, a surface tension modifier, a defoaming agent, a leveling additive, a rheology modifier, a wetting agent, an ionic strength modifier, or any combination thereof.

2 Claims, 6 Drawing Sheets

(56) References Cited

U.S. PATENT DOCUMENTS

| | | | |
|---|---|---|---|
| 4,591,951 A | 5/1986 | Iwamoto et al. | |
| 4,640,746 A | 2/1987 | Nobel et al. | |
| 4,681,670 A | 7/1987 | Nobel et al. | |
| 4,749,626 A | 6/1988 | Kadija et al. | |
| 4,756,791 A | 7/1988 | D'Angelo et al. | |
| 4,922,322 A | 5/1990 | Mathew | |
| 4,935,312 A | 6/1990 | Nakayama et al. | |
| 4,959,278 A | 9/1990 | Shimauch et al. | |
| 4,997,516 A | 3/1991 | Adler | |
| 4,997,722 A | 3/1991 | Adler | |
| 5,008,997 A | 4/1991 | Phy | |
| 5,039,576 A | 8/1991 | Wilson | |
| 5,049,718 A | 9/1991 | Spletter et al. | |
| 5,130,275 A | 7/1992 | Dion | |
| 5,160,422 A | 11/1992 | Nishimura et al. | |
| 5,202,179 A | 4/1993 | Kasahara | |
| 5,234,513 A | 8/1993 | Inoue et al. | |
| 5,260,849 A | 11/1993 | Kasahara | |
| 5,277,756 A | 1/1994 | Dion | |
| 5,320,737 A | 6/1994 | Chao et al. | |
| 5,322,823 A | 6/1994 | Ueda et al. | |
| 5,384,204 A | 1/1995 | Yumoto et al. | |
| 5,393,573 A | 2/1995 | MacKay | |
| 5,439,639 A | 8/1995 | Vianco et al. | |
| 5,492,595 A | 2/1996 | Carano et al. | |
| 5,698,087 A | 12/1997 | Bokisa | |
| 5,724,727 A | 3/1998 | Chopra et al. | |
| 5,730,851 A | 3/1998 | Arrowsmith et al. | |
| 5,750,017 A | 5/1998 | Zhang | |
| 5,798,286 A | 8/1998 | Faraci et al. | |
| 5,807,519 A | 9/1998 | Suzuki et al. | |
| 5,861,076 A | 1/1999 | Adlam | |
| 5,879,568 A | 3/1999 | Urasaki et al. | |
| 5,889,083 A * | 3/1999 | Zhu | 523/161 |
| 5,990,197 A | 11/1999 | Escano et al. | |
| 6,010,771 A | 1/2000 | Isen et al. | |
| 6,093,503 A | 7/2000 | Isoyama et al. | |
| 6,099,713 A | 8/2000 | Yanada et al. | |
| 6,139,777 A | 10/2000 | Omoya et al. | |
| 6,147,400 A | 11/2000 | Faraci et al. | |
| 6,165,386 A | 12/2000 | Endo et al. | |
| 6,200,732 B1 | 3/2001 | Tamura et al. | |
| 6,238,847 B1 | 5/2001 | Axtell et al. | |
| 6,248,455 B1 | 6/2001 | Adams et al. | |
| 6,297,142 B1 | 10/2001 | Mita et al. | |
| 6,306,947 B1 * | 10/2001 | Morishima et al. | 524/457 |
| 6,361,823 B1 | 3/2002 | Bokisa et al. | |
| 6,426,548 B1 | 7/2002 | Mita et al. | |
| 6,433,409 B2 | 8/2002 | Mita et al. | |
| 6,472,459 B2 | 10/2002 | Morales et al. | |
| 6,530,944 B2 | 3/2003 | West et al. | |
| 6,554,914 B1 | 4/2003 | Rozbicki et al. | |
| 6,583,500 B1 | 6/2003 | Abbott et al. | |
| 6,603,205 B2 | 8/2003 | Miura | |
| 6,638,847 B1 | 10/2003 | Cheung et al. | |
| 6,646,330 B2 | 11/2003 | Kubara et al. | |
| 6,651,521 B2 | 11/2003 | Carbone et al. | |
| 6,664,492 B1 | 12/2003 | Babb et al. | |
| 6,679,937 B1 | 1/2004 | Kodas et al. | |
| 6,682,584 B2 | 1/2004 | Pozarnsky et al. | |
| 6,720,499 B2 | 4/2004 | Bokisa et al. | |
| 6,773,827 B2 | 8/2004 | Higuchi | |
| 6,773,828 B1 | 8/2004 | Ooi et al. | |
| 6,774,036 B2 | 8/2004 | Goldstein | |
| 6,783,569 B2 | 8/2004 | Cheon et al. | |
| 6,828,660 B2 | 12/2004 | Abbott | |
| 6,860,981 B2 | 3/2005 | Schetty, III et al. | |
| 6,899,775 B2 | 5/2005 | Hill et al. | |
| 6,917,098 B1 | 7/2005 | Yamunan | |
| 6,951,666 B2 | 10/2005 | Kodas et al. | |
| 7,019,391 B2 | 3/2006 | Tran | |
| 7,062,848 B2 | 6/2006 | Pan et al. | |
| 7,084,067 B2 | 8/2006 | Geusic et al. | |
| 7,087,523 B2 | 8/2006 | Grigoropoulos et al. | |
| 7,153,775 B2 | 12/2006 | Geusic | |
| 7,160,629 B2 | 1/2007 | Crosby | |
| 7,179,362 B2 | 2/2007 | Dietterle et al. | |
| 7,195,702 B2 | 3/2007 | Bokisa, Sr. et al. | |
| 7,215,014 B2 | 5/2007 | Su et al. | |
| 7,252,699 B2 | 8/2007 | Perry et al. | |
| 7,262,603 B1 | 8/2007 | Benton et al. | |
| 7,294,366 B2 | 11/2007 | Renn et al. | |
| 7,297,902 B2 | 11/2007 | Weiss | |
| 7,316,725 B2 | 1/2008 | Kodas et al. | |
| 7,357,681 B2 | 4/2008 | Yamagami et al. | |
| 7,391,116 B2 | 6/2008 | Chen et al. | |
| 7,482,540 B2 | 1/2009 | Shukushima et al. | |
| 7,507,618 B2 | 3/2009 | Dunbar | |
| 7,547,479 B2 | 6/2009 | Wessling | |
| 7,776,196 B2 | 8/2010 | Fujimoto et al. | |
| 7,786,024 B2 | 8/2010 | Stumbo et al. | |
| 7,867,413 B2 * | 1/2011 | Lee et al. | 252/512 |
| 7,879,131 B2 | 2/2011 | Yaniv et al. | |
| 7,976,733 B2 * | 7/2011 | Chopra et al. | 252/512 |
| 2002/0148386 A1 * | 10/2002 | Woosman et al. | 106/31.27 |
| 2002/0158342 A1 | 10/2002 | Tuominen et al. | |
| 2002/0185716 A1 | 12/2002 | Abys et al. | |
| 2002/0187364 A1 | 12/2002 | Heber et al. | |
| 2002/0192492 A1 | 12/2002 | Abys | |
| 2003/0025182 A1 | 2/2003 | Abys et al. | |
| 2003/0151030 A1 | 8/2003 | Gurin | |
| 2003/0168639 A1 | 9/2003 | Cheon et al. | |
| 2003/0226758 A1 | 12/2003 | Egli | |
| 2004/0026256 A1 | 2/2004 | Lindgren | |
| 2004/0026684 A1 | 2/2004 | Empedocles | |
| 2004/0118696 A1 | 6/2004 | Zhang et al. | |
| 2004/0131934 A1 | 7/2004 | Sugnaux et al. | |
| 2004/0132299 A1 | 7/2004 | Matsuda et al. | |
| 2004/0134379 A1 | 7/2004 | Wong et al. | |
| 2004/0147618 A1 | 7/2004 | Lee et al. | |
| 2004/0175631 A1 | 9/2004 | Crocker et al. | |
| 2004/0192042 A1 * | 9/2004 | Sirringhaus et al. | 438/689 |
| 2004/0232000 A1 | 11/2004 | Crosby | |
| 2004/0241532 A1 | 12/2004 | Kim | |
| 2004/0256239 A1 | 12/2004 | Whitlaw et al. | |
| 2005/0019543 A1 | 1/2005 | Lyles | |
| 2005/0078158 A1 | 4/2005 | Magdassi et al. | |
| 2005/0097987 A1 | 5/2005 | Kodas et al. | |
| 2005/0145502 A1 | 7/2005 | Schetty, III et al. | |
| 2005/0148164 A1 | 7/2005 | Casey et al. | |
| 2005/0183768 A1 | 8/2005 | Roscheisen et al. | |
| 2005/0218398 A1 | 10/2005 | Tran | |
| 2005/0230042 A1 | 10/2005 | Hasimoto | |
| 2005/0249967 A1 | 11/2005 | Egli | |
| 2005/0249968 A1 | 11/2005 | Xu et al. | |
| 2005/0249969 A1 | 11/2005 | Xu et al. | |
| 2005/0274480 A1 | 12/2005 | Barsoum et al. | |
| 2006/0011267 A1 | 1/2006 | Kay et al. | |
| 2006/0054668 A1 | 3/2006 | Severin | |
| 2006/0057502 A1 | 3/2006 | Okada et al. | |
| 2006/0062701 A1 | 3/2006 | Nakamura et al. | |
| 2006/0068218 A1 | 3/2006 | Hooghan | |
| 2006/0073680 A1 | 4/2006 | Han et al. | |
| 2006/0082952 A1 | 4/2006 | Toshiaki | |
| 2006/0090819 A1 | 5/2006 | Egli | |
| 2006/0091121 A1 | 5/2006 | Zanolli et al. | |
| 2006/0110424 A1 | 5/2006 | Lyles | |
| 2006/0111467 A1 | 5/2006 | Reinhardt et al. | |
| 2066/0096867 | 5/2006 | Bokisa et al. | |
| 2006/0141268 A1 | 6/2006 | Kalkan et al. | |
| 2006/0159838 A1 * | 7/2006 | Kowalski et al. | 427/58 |
| 2006/0163744 A1 | 7/2006 | Vanheusden et al. | |
| 2006/0183055 A1 | 8/2006 | O'Neill et al. | |
| 2006/0189113 A1 | 8/2006 | Vanheusden et al. | |
| 2006/0234519 A1 | 10/2006 | Pan et al. | |
| 2006/0240591 A1 | 10/2006 | Grier et al. | |
| 2006/0286301 A1 | 12/2006 | Murata et al. | |
| 2007/0007144 A1 | 1/2007 | Schetty, III | |
| 2007/0040191 A1 | 2/2007 | Bezryadin et al. | |
| 2007/0051927 A1 | 3/2007 | Itoh et al. | |
| 2007/0074316 A1 | 3/2007 | Alden et al. | |
| 2007/0095879 A1 | 5/2007 | Holmes | |
| 2007/0105395 A1 | 5/2007 | Kinzel et al. | |
| 2007/0117475 A1 | 5/2007 | Tu | |

| | | | |
|---|---|---|---|
| 2007/0144305 A1 | 6/2007 | Jablonski et al. | |
| 2007/0145375 A1 | 6/2007 | Cho | |
| 2007/0148972 A1 | 6/2007 | Hara et al. | |
| 2007/0158204 A1 | 7/2007 | Taylor et al. | |
| 2007/0163643 A1 | 7/2007 | Van Duren | |
| 2007/0166453 A1 | 7/2007 | Van Duren et al. | |
| 2007/0175296 A1 | 8/2007 | Subramanian et al. | |
| 2007/0176991 A1 | 8/2007 | Arai et al. | |
| 2007/0190326 A1 | 8/2007 | Perry et al. | |
| 2007/0218312 A1 | 9/2007 | Sakuyama et al. | |
| 2007/0275262 A1 | 11/2007 | Lin et al. | |
| 2007/0281136 A1 | 12/2007 | Hampden-Smith et al. | |
| 2007/0281249 A1 | 12/2007 | Tutt et al. | |
| 2007/0284700 A1 | 12/2007 | Jackson et al. | |
| 2007/0287022 A1 | 12/2007 | Jackson et al. | |
| 2007/0287023 A1 | 12/2007 | Jackson et al. | |
| 2007/0287024 A1 | 12/2007 | Jackson et al. | |
| 2007/0289483 A1* | 12/2007 | Cho et al. ................... | 106/31.13 |
| 2007/0295530 A1 | 12/2007 | Jackson et al. | |
| 2008/0020304 A1 | 1/2008 | Schroder et al. | |
| 2008/0075934 A1 | 3/2008 | Barlow et al. | |
| 2008/0083950 A1 | 4/2008 | Pan et al. | |
| 2008/0143906 A1 | 6/2008 | Allemand et al. | |
| 2008/0169122 A1* | 7/2008 | Shiraishi et al. .............. | 174/257 |
| 2008/0193667 A1* | 8/2008 | Garbar et al. ................. | 427/532 |
| 2008/0286488 A1 | 11/2008 | Li et al. | |
| 2008/0305268 A1 | 12/2008 | Norman et al. | |
| 2009/0142481 A1 | 6/2009 | Chopra et al. | |
| 2009/0286383 A1 | 11/2009 | Jiang et al. | |
| 2010/0000762 A1 | 1/2010 | Yang et al. | |
| 2010/0035375 A1 | 2/2010 | Grigoropoulos et al. | |
| 2011/0043965 A1 | 2/2011 | Yaniv et al. | |

FOREIGN PATENT DOCUMENTS

| | | |
|---|---|---|
| JP | 10-308119 | 11/1998 |
| JP | 11-319538 | * 11/1999 |
| JP | 2001-325831 | 11/2001 |
| JP | 2008006513 | 1/2008 |
| WO | 03106573 A1 | 12/2003 |
| WO | 2004005413 A1 | 1/2004 |
| WO | 2006072959 | 7/2006 |

OTHER PUBLICATIONS

TEGO 425 Datasheet; http://evonik.tego.de/pdf/daten/amer/Flow_425.pdf.*

International Search Report and Written Opinion for International Application No. PCT/US09/49510, mailed Oct. 19, 2009.

International Preliminary Report on Patentability, International Application No. PCT/US2009/044196, dated Nov. 25, 2010, 6 pages.

International Preliminary Report on Patentability, International Application No. PCT/US2009/044195, dated Nov. 25, 2010, 5 pages.

International Preliminary Report on Patentability, PCT/US2008/063890, Dec. 3, 2009.

International Search Report and Written Opinion of the International Searching Authority, or the Declaration for PCT/US10/28799, dated May 19, 2010.

International Search Report and the Written Opinion on the International Searching Authority for PCT/US10/28811, dated May 18, 2010.

International Search Report and Written Opinion for Application No. PCT/US/09/35717, dated May 5, 2009, 7 pages.

Schroder et al. "Broadcast Photonic Curing of Metallic Nanoparticle Films" Nanotechnologies, Inc. publication, 4 pages.

Lu et al. "Ultra Strength and High Electrical Conductivity in Copper" Science Magazine, Apr. 2004, vol. 304, 6 pgs.

Volkman et al. "Ink-jetted Silver/Copper Conductors for printed RFID Applications" Materials Research Society magazine, 2004, vol. 814, 6 pgs.

Wu et al. "One-Step Green Route to Narrowly Dispersed Copper Nanocrystals" Journal of Nanoparticle Research, 2006, pp. 965-969, 5 pages.

Curtis et al. "Spray and Inkjet Printing of Hybrid Nanoparticle-Metal-Organic Inks for Ag and Chu Metallizations" Materials Research Society magazine, 2001, vol. 676, 6 pages.

Shacham-Diamond "Electroless Copper Deposition Using Glyoxylic Acid as Reducing Agent for Ultralarge Scale Integration Metallization" manuscript published by Electrochemical and Solid-State Letters, Apr. 2000, pp. 279-282, 4 pages.

Yeshchenko et al. "Size-Dependent Melting of Spherical Copper Nanoparticles" article published by National Taras Shevchenko Kyiv University, Jan. 2007, 16 pgs.

Virang G. Shah, "Trimming and Printing of Embedded Resistors Using Demand-Mode Ink-Jet Technology and Conductive Polymer," IPC Printed Circuit Expo (2002) pp. 1-5.

International Search Report for PCT/US08/63890 mailed Aug. 6, 2008, 9 pgs.

Niizeki et al. "Laser Sintering of Ag Nanopaste Film and Its Application to Bond-Pad Formation," 2008 Electronic Components and Technology Conference, IEEE, pp. 1745-1750.

Lee et al. "Spontaneous Growth Mechanism of Tin Whiskers," Acta mater. vol. 46, No. 10, pp. 3701-3714, 1998.

Gaylon, "Annotated Tin Whisker Bibliography and Anthology," IEEE Transactions on Electronics Packaging Manufacturing, vol. 28, No. 1, Jan. 2005, pp. 94-122.

Lal et al., "Role of Intrinsic Stresses in the Phenomena of Tin Whiskers in Electrical Connectors." IEEE Transactions on Electronics Packing Manufacturing, vol. 28, No. 1, Jan. 2005, pp. 63-74.

Boettinger et al., "Whisker and Hillock Formation on Sn, Sn—Cu and Sn—Pb Electrodeposits," Acta Materialia, 53, Sep. 8, 2005, pp. 5033-5050.

Mitooka et al., "Effect of Laser Irradiation on Generation and Growth of Whiskers in Tin-Electroplated Film,", J. Japan Inst. Metals, vol. 73, No. 3, (2009), pp. 226-233.

Osenbach et al., "Sn Corrosion and Its Influence on Whisker Growth," IEEE Transactions on Electronic Packaging Manufacturing, vol. 30, No. 1, Jan. 2007, pp. 23-35.

Osenbach et al., "Sn Whiskers: Material, Design, Processing, and Post-Plate Reflow Effects and Development of an Overall Phenomenological Theory," IEEE Transactions on electronics Packaging Manufacturing, vol. 28, No. 1, Jan. 2005, pp. 36-62.

Osterman, "Mitigation Strategies for Tin Whiskers," Release 1.0, Aug. 28, 2002, 11 pages.

Schroeder et al., "Tin Whisker Test Method Development," IEEE Transactions Electronics Packaging Manufacturing, vol. 29, No. 4, Oct. 2006, pp. 231-238.

International Search Report and Written Opinion for International Application No. PCT/US09/44196 mailed Jun. 30, 2009, 13 pages.

International Search Report and Written Opinion for International Application No. PCT/US09/44195 mailed Jun. 25, 2009, 7 pages.

Supplemental European Search Report; Application No. EP 09774505 dated Jun. 29, 2011.

Kogelschatz, "Excimer Lamps: History, Discharge Physics, and Industrial Applications", Proc. SPIE, vol. 5483, 2004, pp. 272-286.

Kim et al., "Cyclic Properties of Si-Cu/Carbon Nanocomposite Anodes for Li-Ion Secondary Batteries", Journal of the Electrochemical Society, vol. 152, No. 3, pp. A-523-A-526. Jan. 24, 2005, retrieved from internet Aug. 26, 2010.

International Search Report and the Written Opinion of the International Searching Authority for PCT/US10/042169, mailed on Sep. 7, 2010, 4 pages.

Yaniv, "Novel Inkettable Copper Ink Utilizing Processing Temperatures Under 100 Degrees C Without the Need of Inert Atmosphere", Presentation at Printed Electronics Europe Conference. pp. 1-25, Apr. 7-8. 2009, retrieved from internet Aug. 26, 2010.

International Preliminary Report on Patentability, PCT/US2010/042169, Jan. 17, 2012.

Notice on the First Office Action; Patent Application No. 200980108344.1, Jan. 21, 2012.

Notice of the First Office Action, Application No. 200880021733.6 dated Jun. 22, 2011.

Supplementary European Search Report, Application No. EP08755692, dated Aug. 6, 2010.

European Patent Office, Examination Report, Application No. 08 755 692.4, Apr. 13, 2012.

Champion et al., "Sintering of copper nanopowders under hydrogen: an in situ X-ray diffraction analysis," Materials Science and Engineering A, vol. 360, No. 1-2, Nov. 1, 2003, pp. 258-263.

The State Intellectual Property Office of the People's Republic of China, Notice on Grant of Patent Right For Invention, Application No. 200880021733.6, Apr. 20, 2012.

The State Intellectual Property Office of the People's Republic of China, Notice on the First Office Action, Application No. 200930125925.6. Mar. 31, 2012, 8 pages.

Korean Intellectual Property Office, Chemistry & Biotechnology Examination Bureau, Notice to File a Response. Patent Application No. 10-2010-7022240, May 8, 2012.

United States Patent & Trademark Office, Non-Final Office Action Summary, U.S. Appl. No. 12/496,453, dated Jun. 13, 2012.

European Patent Office, Examination Report, Application No. 09774505.3, dated Sep. 26, 2012.

Untied States Patent & Trademark Office, Non Final Office Action, U.S. Appl. No. 12/466,306, dated Nov. 7, 2012.

* cited by examiner

ADDITIVES AND MODIFIERS FOR SOLVENT- AND WATER-BASED METALLIC CONDUCTIVE INKS

CROSS-REFERENCE TO RELATED APPLICATIONS

This application claims the benefit under 35 U.S.C. §119 (e)(1) of U.S. provisional application Ser. No. 61/034,087, filed Mar. 5, 2008, and U.S. provisional application Ser. No. 61/113,913, filed Nov. 12, 2008, both of which are hereby incorporated by reference herein.

TECHNICAL FIELD

The present invention is related to conductive inks.

GENERAL

Printed conductive films have the potential to lower manufacturing costs for microelectronics and large area electronics. Recently, metal nanoparticles having consistent size and shape have been developed. The inventors have discovered that these nanoparticles may be used to prepare well-dispersed inks. These metallic ink dispersions may be used for printing conductors, thereby making the direct writing of electronic circuits possible. Silver and gold nanoparticle-based inks are beginning to be used for printing electronics. These metals may be used because of their relatively high stabilities toward oxidation by molecular oxygen. Copper, with a resistivity of 1.7 $\mu\Omega\cdot cm$, has been extensively used for electronics and microelectronic chips. Moreover, copper is less costly than silver or gold, thereby making it a more attractive material for printed conductors. Oxidation of copper nanoparticles during printing and curing, however, has been difficult to avoid.

To achieve a stable dispersion of metal nanoparticles, dispersants are adsorbed onto the surface of the nanoparticles. The function of these dispersants is to keep the individual nanoparticles apart and prevent them from aggregating and agglomerating together. Dispersants may be organic polymers or long chain molecules. Such compounds have high boiling points or decomposition temperatures, and are difficult to remove during a curing process. Any residues from these dispersants remaining in the cured metallic films will result in higher resistivities being obtained in the metal conductor that is formed because these dispersants and their decomposition products are non-conducting organic compounds, or insulators.

SUMMARY

In one aspect, a conductive ink includes metallic nanoparticles, a polymeric dispersant, and a solvent. In some implementations, the polymeric dispersant may be ionic, non-ionic, or any combination of ionic and non-ionic polymeric dispersants. The boiling point of the polymeric dispersant may be less than about 150° C. In some implementations, the solvent includes water, an organic solvent, or any combination thereof. The boiling point of the organic solvent may be less than about 150° C. In certain implementations, the conductive ink includes a stabilizing agent, an adhesion promoter, a surface tension modifier, a defoaming agent, a leveling additive, a rheology modifier, a wetting agent, an ionic strength modifier, or any combination thereof. In some implementations, the metallic nanoparticles comprise about 10 wt % to about 60 wt % of the ink. In certain implementations, the polymeric dispersant comprises about 0.5 wt % to about 20 wt % of the ink.

In another aspect, a conductive ink includes about 15 wt % to about 65 wt % copper nanoparticles, a vehicle comprising about 10 wt % to about 50 wt % alcohol and about 50 wt % to about 80 wt % water, and a dispersant. The alcohol may be isopropanol, isobutyl alcohol, ethanol, polyvinyl alcohol, ethylene glycol, or combinations thereof. In some cases, the dispersant may be polyvinylpyrrolidone, polyethylene glycol, isostearyl ethylimidazolinium ethosulfate, oleyl ethylimidazolinium ethosulfate, or combinations thereof. In some cases, the dispersant may be phosphoric acid modified phosphate polyester copolymers, sulfonated styrene maleic anhydride esters, or combinations thereof.

In some implementations, the vehicle includes about 10 wt % to about 50 wt % water, about 40 wt % to about 60 wt % cyclohexanol, and an amount of isopropanol such that a ratio of water to isopropanol is between about 1:1 and about 1:2. In other implementations, the vehicle includes about 10 wt % to about 30 wt % water, about 20 wt % to about 80 wt % isobutanol, and an amount of isopropanol such that a ratio of water to isopropanol is between about 1:1 and about 1:2.

In some implementations, the conductive ink is curable to form a film with a resistivity of less than about 10 $\mu\Omega\cdot cm$, less than about 20 $\mu\Omega\cdot cm$, or less than about 200 $\mu\Omega\cdot cm$. The film may be substantially free of imperfections, such as pin holes.

DETAILED DESCRIPTION

Metallic inks suitable for forming conductors may be formulated with metal nanoparticles, conductive polymers, and a carrier system, such as water, organic solvents, or a combination thereof. The nanoparticles may be, for example, copper, silver, nickel, iron, cobalt, aluminum, palladium, gold, tin, zinc, cadmium, etc., or any combination thereof. The nanoparticles may be about 0.1 μm (100 nm) in diameter or smaller. Steps to form a stable dispersion from a metallic nanopowder may include wetting the powder, breaking up agglomerates in the powder (de-agglomerating), and stabilizing the dispersed particles to inhibit flocculation. In some cases, a dispersant or surfactant may be added to facilitate de-agglomeration of the powder. In some cases, the dispersant that provides the best performance at one step of the process may not provide the best performance at another step. Thus, it may be beneficial to incorporate more than one dispersant or surfactant.

Unlike the insulating residues of common dispersants, conductive organic compounds such as conductive polymers may not act as an insulating defect in the metallic conductors, but instead may act as a parallel-serial resistor (R2) with a metallic conductor (R1). The resistivity of the conductive polymer ($\rho 2$) may be as low as 0.001 $\Omega \cdot$cm. By comparison, the resistivity of the metallic conductors ($\rho 1$) is in the region of $10^{-6}$ $\Omega \cdot$cm. The total resistance (R) may be described as:

$$R = \frac{R1 R2}{R1 + R2}$$
$$= R1\left(\frac{1}{1 + \frac{R1}{R2}}\right)$$
$$\sim R1\left(\frac{1}{1 + \frac{S2\rho 1}{S1\rho 2}}\right)$$

where $$\frac{\rho 1}{\rho 2} \leq 0.001,$$

and S1 and S2 are the cross-sectional areas of the conductive polymer and the fused nanoparticles, respectively. The S2/S1 ratio is smaller than 0.1. Thus, R≦R1, meaning that the total resistance is smaller than that of the metallic conductor, but not significantly smaller. Thus, residual conductive polymer may not increase the resistivity as much as insulating residues from non-conducting dispersants. If the conductive polymer is also the dispersant for metallic nanoparticles, the resistivity of the resulting metallic films may be significantly reduced, due at least in part to limited or no additional contamination from residual non-conducting dispersants. In some cases, metal inks may be cured to obtain conductive metal films with resistivities close to those of the bulk metal conductor itself.

Steric stabilization, electrostatic stabilization, or a combination thereof may be used to prepare dispersions that remain stable during storage and deposition, thus yielding uniform and consistent coatings. Steric stabilization of metal nanoparticles may be achieved with a non-ionic dispersant or polymer. Steric contributions include interactions between the surface of the metal nanoparticles and functional groups of polymers or long chain organic molecules, thereby making direct contact between the metal particles (e.g., formation of aggregates and agglomerates) less likely. Strong interaction between the polymers or the long chain molecules and the solvent or water may inhibit the polymers from coming too closely into contact with one another. Electrostatic stabilization occurs when charged (e.g., substantially equally charged) nanoparticles repel each other, thereby allowing the metal nanoparticles to stay apart and substantially avoid contact with each other. Electrostatic stabilization of a charged metal nanoparticle may be achieved with an ionic dispersant or polymer. Dispersants with a high hydrophile-lipophile balance (HLB) may be used with aqueous dispersions, and dispersants with a low HLB may be used with dispersions in non-polar organic liquids.

Nanoparticle dispersion may also be enhanced by charging a surface of a metal nanoparticle. Metallic nanoparticles may have an oxide layer on their surface. The oxide layer may have a thickness of, for example, about 1 nm to about 20 nm. In the presence of water, an acid-base reaction may occur, forming a hydroxide layer on the surface. The hydroxide layer may adsorb or lose protons to produce a positively or negatively charged surface. Thus, charging through proton gain or loss, or charging by adsorbed charges, may be involved in achieving a good dispersion. At low pH, the hydroxide surface may react with protons to produce a positively charged surface. In contrast; at high pH, protons may be removed to produce a negatively charged surface. Thus anionic and cationic dispersants may be adsorbed onto the surface of metal nanoparticles under conditions that depend on the pH of the solution or dispersion. Therefore, charged conductive polymers having oppositely charged polyacid functionalities for charge compensation may be used to advantageously disperse metal nanoparticles in aqueous inks.

Figure 1:
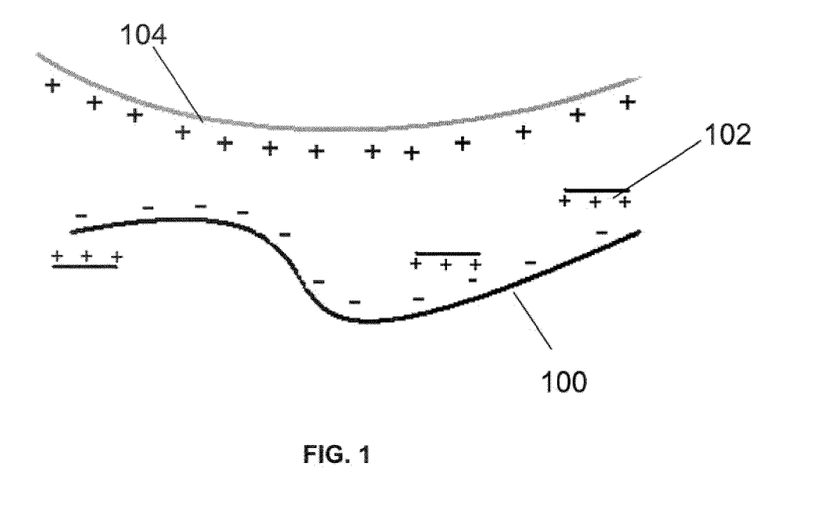
FIG. 1 illustrates a dispersant for metallic particles with both cationic and anionic polymeric groups.

Anionic polymeric dispersants, cationic polymeric dispersants, or a combination thereof may be used to form electrostatic dispersions with charged metallic surfaces in aqueous media. Since, inorganic particle surfaces may be heterogeneous, with both positive and negative sites, dispersants having negatively and/or positively charged anchor groups may be advantageous. Positively charged nanoparticles may form an electrostatic dispersion with a dispersant containing both anionic and cationic polymer chains. FIG. 1 illustrates an embodiment of a dispersant with a combination of both anionic 100 and cationic 102 polymeric groups for the dispersion of metallic particles 104. In some cases, the metallic surface may be heterogeneous, having both negatively and positively charged sites. With both anionic and cationic groups present in the dispersant, the dispersant is compatible with the different charge regions on the metal nanoparticles, and a stable dispersion may be achieved.

Figure 2:
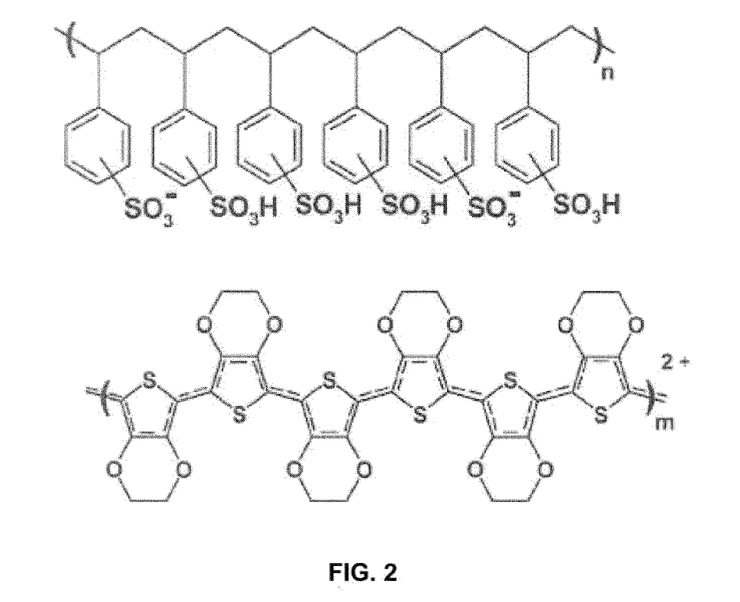
FIG. 2 illustrates the chemical structure of 3,4-polyethylenedioxythiophene-polystyrenesulfonate (PEDOT:PSS).
Figure 3:
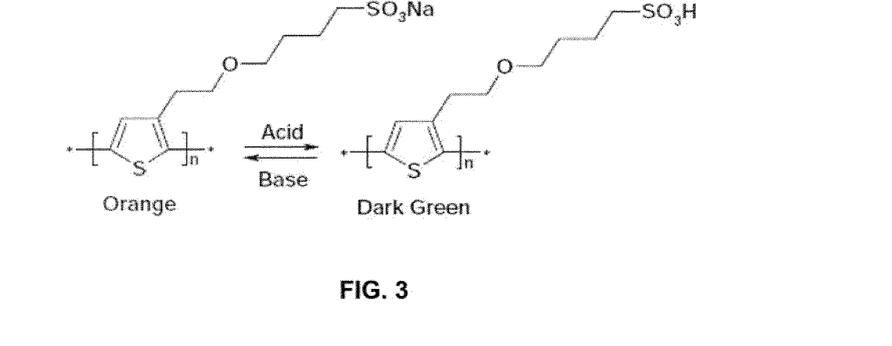
FIG. 3 illustrates the acid-base equilibrium of a substituted polythiophene.

Conductive polymers including, but not limited to, conductive polythiophenes, conductive polyanilines, metallophthalocyanines, and metalloporphyrins may be used to prepare aqueous metallic inks. 3,4-polyethylenedioxythiophene-polystyrenesulfonate (PEDOT:PSS), illustrated FIG. 2, is an example of a conducting polymer that may be used to prepare aqueous metallic inks. The substituted polythiophene (PT) illustrated in FIG. 3 is another example of a conductive polymer that may be used to prepare aqueous metallic inks. In an implementation in which ionic polythiophene conducting polymers are used to prepare aqueous metallic inks, the positive charge may be located within a polythiophene network. In another implementation, the positive charge may be appended as a cation such as, for example, sodium. In each case, the multifunctional structure allows for low concentrations to be used to achieve stable nanoparticle dispersions.

Figure 4:
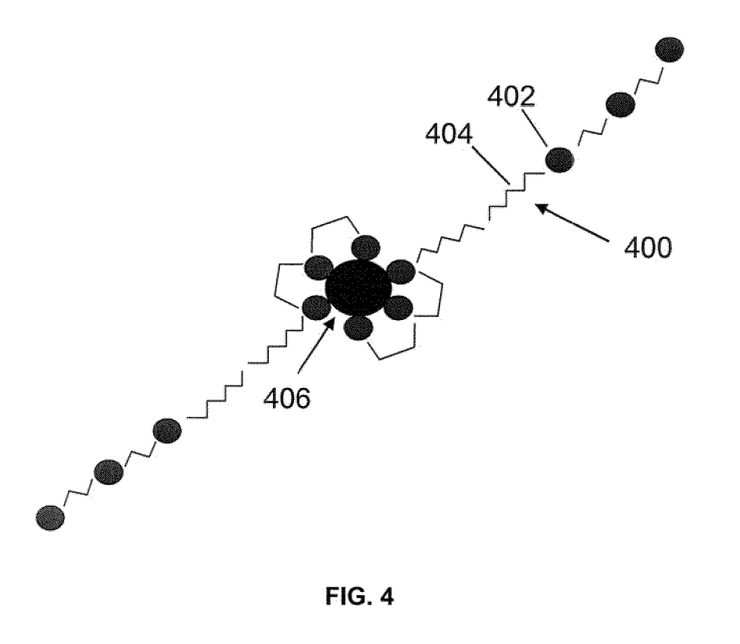
FIG. 4 illustrates a double layer polymeric dispersant on a metal nanoparticle.

Conducting polymers with multiple binding sites may partially surround a metal nanoparticle, thereby keeping it from aggregating or agglomerating. FIG. 4 illustrates a double layer of a polymeric dispersant 400 with head group 402 and tail group 404 on a nanoparticle 406. The nanoparticle 406 may be, for example, copper. This multi-site attachment of a polymer to a nanoparticle leads to a thermodynamic advantage over a dispersant that only attaches via a single site. The head group 402 may include, for example, amines, cationic alkylammonium groups, carboxylic acids, sulfonic acids, and phosphoric acid groups, along with their salts that have carboxylate, sulfonate and phosphate or phosphonate groups.

In addition to the thermodynamic advantage that is gained by having multiple attachment points between the nanoparticle 406 and the head group 402 of a conductive polymer, there is also an advantage in the conducting polymer having a tail group to it. The tail group may be a long chain functional group able to bend and rotate, sweeping out a large "excluded volume" that cannot be easily occupied by other nanoparticles, thus inhibiting other metal nanoparticles from approaching closely to the metal nanoparticle associated with the dispersant and aggregating or agglomerating with the dispersed metal nanoparticle. For example, long chain alkyl or alkoxy functionalities have a high degree of conformational flexibility, which allows them to create a high exclusion volume. Another advantage of a high exclusion volume is that it allows for a low concentration of dispersant to be used, and therefore, only a small quantity of dispersant to be removed during the curing process.

A dispersant 400 may be selected such that the head group 402 is chemically compatible with or preferentially associates with the nanoparticle 406, and the tail group 404 is chemically compatible with or preferentially associates with the vehicle (solvent). In a dispersion, the dispersant 400 may act as a molecular bridge between the nanoparticle 406 and the vehicle, thereby keeping the nanoparticles separated by one or more molecular layers. The solubility of the tail group 404 of the dispersant 400 in the vehicle is also a factor in the selection of a dispersant for a given ink formulation.

The head group 402 of a dispersant 400 may be selected such that the functionality of the group is compatible with the metal nanoparticle 406 in an ink formulation. That is, the attraction between the head group 402 and the nanoparticle 406 is advantageously stronger than the attraction between the head group and the vehicle in the system. The attraction may include charge attraction, specific donor-acceptor bands between unshared electron pairs and empty molecular orbitals, hydrogen bonding, electrostatic field trapping of polarizable molecules, or any combination thereof. For metal nanoparticles with positively or negatively charged surfaces, conductive metallic inks have been prepared using anionic components such as halide or carboxylate ions, or cationic components such as hydrogen ions or group I cations, respectively. When the head group 402 is a polymer, the polymer may provide multiple anchoring sites and thus multiple site coverage of the nanoparticle 406.

In some embodiments, a dispersion of metal nanoparticles is formed by adding the nanoparticles to a dispersion of a conductive polymer. A dispersion of the conductive polymer may be formed by adding the polymer to a carrier. The carrier may be, for example, water, an organic solvent, or any combination thereof. The pH of the dispersion may be from about 1 to about 12. Metal nanoparticles may be added to the conductive polymer dispersion to form a metal nanoparticle dispersion.

Conductive metallic inks may include a loading concentration of metallic nanoparticles in a range from about 10 wt % to about 65 wt %, or from about 15 wt % to about 60 wt %, of metal nanoparticles.

An effective amount of dispersant may be used to achieve monolayer coverage of the nanoparticles with the head groups of the dispersant such that the surface of nanoparticle is substantially inaccessible to other nanoparticles for aggregation or agglomeration. In some ink formulations, for example, an effective weight percentage of dispersant may be in a range from about 0.1 wt % to about 20 wt %, or about 0.5 wt % to about 10 wt %. Coverage of less than a monolayer leaves open sites on the nanoparticle that may cause agglomeration. If a second monolayer of dispersant is present on the nanoparticle, the second layer may be oriented in the opposite direction from the first layer, thereby reducing the compatibility of the nanoparticle with the solvent.

Polymeric dispersants may have higher viscosities than liquids used as vehicles in conductive inks. A higher viscosity promotes forming of a dispersion suitable for ink-jet printing methods. Also, the presence of multiple nanoparticle binding sites allows polymeric dispersants to be used at lower concentration than monomeric dispersants with single binding sites, aid still confer monolayer coverage of the metal nanoparticle. Lower concentrations of the dispersant are favorable because less organic material remains after the curing process.

Other additives such as, for example, dimethyl sulfoxide and oxy-bis-ethanol, may be present in the dispersion in various amounts such as, for example, about 1 wt % to about 5 wt %. In some implementations, polyacids, such as polystyrenesulfonic acid, may be used for charge compensation in an ink formulation.

When agglomerates are present in a nanopowder, de-agglomeration facilitates formation of a stable dispersion. In some cases, nanoparticles in a metallic nanopowder may be agglomerated through a salt bridge, including a soluble salt precipitated in the formation of the nanopowder. These salt bridges may be dissolved by a dispersant to break up the agglomerates. Dispersants that infiltrate crevices between nanoparticles in a nanopowder may also reduce the energy required to propagate cracks through the solid, and may thereby function as grinding aids.

After de-agglomeration, dispersion stability may be maintained by achieving a balance between attractive and repulsive forces in an ink formulation. The maintenance of a dispersion may be assisted by mechanically breaking up the agglomerates with a ball mill or other device, sonication (e.g., ultrasonication), and the like. These mechanical processes may be carried out in the presence of a dispersant to reduce the occurrence of re-agglomeration after mechanical agitation.

Conductive metallic inks with good dispersion may be printed by processes including, for example, draw-down or ink-jet printing. Other printing methods, including spin-casting, spraying, screen printing, flexo printing, gravure printing, roll-to-roll coating, and the like, may also be used for depositing conductive metallic inks. The inks may be deposited on substrates, including flexible substrates such as polyimide (e.g., KAPTON®, available from E.I. du Pont de Nemours and Company, Wilmington, Del.) liquid crystalline polymers (LCPs), MYLAR® and polyethylene terephthalate (PET).

After the ink has been applied to a substrate, a pre-cure process may be conducted in air and at temperatures less than about 150° C. The pre-curing step facilitates drying of the printed or coated metal nanoparticles before curing, thereby reducing rapid evaporation of volatile compounds during curing, and substantially eliminating film discontinuities and rough surfaces resulting from this rapid evaporation.

The printed and dried inks may be cured. Curing methods include an optical flash system, a pulsed laser with suitable wavelengths, and other short-pulsed lamps. The printed metal inks, after the pre-cure drying step, may be black and therefore able to absorb light over a broad range of wavelengths. The curing process may be carried out at room temperature in air. During an optical (or photonic) curing process, the metallic film may be directly heated by the absorbed light. Non-metallic portions of the substrate may not be directly heated by the absorbed light. If the light intensity is sufficiently high (for example, on the order of a few Joules per square centimeter) and the pulse is sufficiently short (for example, on the order of 300 microseconds or less), then the optical energy delivered to the film may melt the metal nanoparticles. The melted nanoparticles may fuse together. The short duration of the pulse may reduce the amount of energy absorbed by the substrate material.

For some conductive inks, such as copper inks, curing may be achieved by photosintering. During photosintering, metallic nanoparticles are adhered together during photonic curing to form metallic films. Lasers, including continuous and pulsed lasers (e.g., nanosecond to femtosecond lasers) may be used to sinter metallic inks into metallic conductors. The photosintering process may occur on a time scale from microseconds to less than a millisecond. For passivated metallic nanoparticles, the metal oxide layer may be photoreduced to elemental metal, resulting in high-purity metallic conductors. In some-cases, heat from photosintering causes a welding effect between the metal and plastics having relatively low melting points, yielding excellent adhesion between these metallic conductors (or films) and the substrate without the use of binder materials. In the case of passivated copper nanoparticles, photosintering allows the layer of copper oxides to be photoreduced into metallic copper, and fused together to form copper conductors.

For conductive films formed by photosintering copper inks with non-ionic dispersants, a resistivity as low as about 3.6 $\mu\Omega$·cm to about 10 $\mu\Omega$·cm may be achieved (1.7 $\mu\Omega$·cm for bulk copper). For conductive films formed from copper inks including ionic dispersants or ionic and non-ionic dispersants, resistivity as low as about 2.3 $\mu\Omega$·cm to about 10 $\mu\Omega$·cm may be achieved.

The use of such photonic curing to sinter the copper nanoparticles allows for the curing process to be carried out in air. Photonic curing reduces the formation of non-conducting copper oxides that may occur during thermal curing in air. The presence of non-conducting copper oxides in copper films results in high resistivities. In contrast, the photonic curing process occurs in a fraction of a second, and no significant oxidation occurs before the copper cools back to ambient temperature. During the curing process, the copper nanoparticles are fused during the very short curing time, while little or no damage occurs to the substrate, and copper oxides that are present on the surface of the copper nanoparticles are at least partially photoreduced.

For cured films formed from copper nanoparticle ink, a resistivity of about $7\times10^{-6}$ $\Omega$·cm, or about 4 times greater than the resistivity of bulk copper, may be achieved with both draw-down and ink-jet printing methods. Copper inks that may be cured in air to give copper conductors that have resistivities in the $\mu\Omega$·cm range have a very wide range of applications, including fabrication of printed circuit boards (PCBs), flexible electronics, solar panels, and other applications where a metallic conductor needs to be patterned or deposited.

Non-Ionic Polymeric Dispersants for Metallic Inks

The excluded volume of non-ionic (steric) dispersants represents the space "occupied" by the tail group of the dispersant, which may be a flexible alkyl (or ethoxy) chain. This space is substantially free from other nanoparticles. A larger excluded volume separates metal nanoparticles more effectively than a smaller excluded volume, and provides a high level of coverage of the nanoparticle with a low concentration of dispersant.

The following exemplary non-ionic polymers are useful as modifiers in the formulation of inks that are photonically curable to yield good conductors:

1. Surfactants (such as TRITON® X-100, TRITON® X-15, TRITON® X-45, TRITON® QS-15, available from Roche Diagnostics GmbH, Germany).

2. Linear alkyl ethers (such as COLA® CAP MA259 and COLA® CAP MA1610, available from Colonial Chemical, Inc., South Pittsburg, Tenn.).

3. Quaternized alkyl imidazolines (such as COLA®SOLV IES and COLA®SOLV TES, available from Colonial Chemical, Inc.).

4. Polyvinylpyrrolidone (PVP), polyvinyl alcohol (PVA), polyethylene glycol (PEG), and polysiloxanes, polystyrene, alkyl substituted thiphone polymers (such as ADS 304PT and ADS 306PT, available from American Dye Source, Inc., Canada), styrene maleic anhydride copolymer (such as SMA® 2625, SMA® 17352, SMA® 1440 Flake, SMA® 3000, available from Elf Atochem, UK), and polybutadiene adducted with maleic anhydride (such as RICOBOND® 1756 and RICOBOND® 1731, available from Elf Atochem).

Ionic Polymeric Dispersants for Metallic Inks

The following exemplary ionic polymers are useful as modifiers in the formulation of inks that are photonically curable to yield good conductors:

1. Copolymers with ionic groups, including carboxylic acid modified polyester copolymers (such as DISPER-BYK®-111 and 110, available from BYK Chemie, Germany) and high molecular weight block copolymers with pigment affinic groups (such as DISPERBYK®-182, 190, 191, 192 and 194, available from BYK Chemie).

2. Aqueous ammonium solutions of styrene maleic anhydride copolymer (such as SMA® 1440H Solution, an aqueous solution of the ammonium salt of SMA® 1440, available from Elf Atochem) or hydrolyzed styrene maleic acid anhydride copolymer, both of which exhibit good wettability to metallic nanoparticles in an aqueous matrix and may be used as a dispersant in a water-based ink formulation.

3. Conductive polythiophene (PT) with substituted alkyl chains (such as ADS2000P, available from American Dye Source, Inc.), water-soluble sulfonated polystyrene, and a mixture of the polystyrene and polythiophene colloid solutions (such as HCS—P, HCS—N, available from H. C. Starck GmbH, Germany).

Solvents such as, for example, 2-butoxyethyl acetate, propylene glycol monomethyl ether acetate, diethylene glycol monoethyl ether acetate, ethylene glycol butyl ether, cyclohexanone, cyclohexanol, 2-ethoxyethyl acetate, ethylene glycol diacetate, water, and the like, may be used with both non-ionic and ionic polymer dispersants to formulate conductive metallic inks.

Formulations Including Non-Ionic and Ionic Polymeric Dispersants

In some cases, both non-ionic and ionic dispersants, such as those listed above, may be used in an ink formulation to form more stable dispersions. Solvents described above, or any combination thereof, may be used as vehicles for ink formulations including non-ionic and ionic dispersants. Solvents including mixtures of i) 2-butoxyethyl acetate and propylene glycol monomethyl ether acetate, ii) 2-ethoxyethyl acetate and propylene glycol monomethyl ether acetate, iii) 2-ethoxyethyl acetate and amyl acetate, and iv) ethylene glycol diacetate and propylene glycol monomethyl ether acetate are effective vehicle systems for ink formulations with both ionic and non-ionic dispersants.

Low Organic Residue Metallic Inks

Metallic inks may be formulated to yield metallic-films with high conductivity. For example, ink formulations with low boiling-point solvents and dispersants leave little organic residue after film formation (e.g., by photosintering), resulting in films with high conductivity. Low boiling-point solvents include, for example, isobutyl alcohol, isopropyl alcohol, ethanol, toluene, butylbenzene, butyl acetate, water, and the like. Low boiling-point dispersants include, for example, amines with relatively low molecular weight, such as hexyl amine, octylamine, and the like These low boiling-point vehicles and dispersants may have boiling points less than about 150° C., or may be vaporized when a pre-cure process at temperatures less than about 150° C. is applied to the coated inks. For the amines with boiling points less than about 150° C., much of the dispersant will be vaporized during the pre-cure process. In an example, high-purity copper films with a resistivity of about 2.5 $\mu\Omega\cdot$cm may be formed by photosintering ink formulations with low boiling point vehicles and dispersants.

Ink Stabilization, Ink-Jet Rheology Control, Coating to Substrate Adhesion Enhancement, and Coating Appearance Improvement Using Additives and Modifiers Additives and modifiers may be used to enhance performance of conductive metallic inks. The properties and amounts of these additives and modifiers may be different for each conductive metallic ink, for each substrate, for each printing method, and the like. These differences may result from different surface energies of substrates, different adhesion properties of substrates, requirements of different printing methods such as ink-jetting, and different strategies used to sinter the metallic inks into metal conductors. The additives and modifiers may be selected to be chemically compatible with both the vehicles and dispersants used in the formulation of the inks. Also, because the surface tension of solvent- and water-based inks may be different, different additives and modifiers may be needed to maintain the desired contact angle between the ink and the substrate.

Additives and modifiers used in conductive metallic inks may act as rheology modifiers, wetting agents, adhesion promoters, binders, defoaming agents, leveling agents, ionic strength modifiers, and the like. Additives and modifiers may be advantageously selected to tailor ink properties for different ink formulations, substrates, and application methods. For example, selection of agents and modifiers allows careful control of ink properties needed for use with a variety of substrates, including modification within substrate types, as well as for use with different delivery methods such as ink-jetting or aerosol jetting, including formulations targeted for specific printer manufacturers, model types, and print heads.

Selection of additives and modifiers for a conductive ink formulation may depend on physico-chemical properties of the vehicle system, the substrate, or any combination thereof. For example, organic-solvent-based inks may have a low surface tension and a small contact angle on many substrates, while a wetting agent may be needed to impart water-based inks with reduced surface tension and desired wetting properties. Substrates with a high surface energy, including flexible substrates such as polyimide, require different additives and modifiers than substrates with a low surface energy, such as glass, silicon, or low surface energy polymeric substrates. Variation in substrate porosity, and consequently, differences in absorption of the conductive ink, may also influence selection of additives and modifiers for a conductive ink formulation.

Additives and modifiers may be chosen such that a conductive ink is able to adhere to flexible substrates, such as polyimide and liquid crystal polymers, while also being able to form conductive patterns or films with electrical resistivities on the same order of magnitude as the analogous bulk metal. These additives provide the ink with wetting and surface tension properties to allow compatibility with the substrate surface and printing equipment, such as ink-jet nozzles, and help maintain a uniform dispersion needed for homogeneous print quality. These additives may be, for example, polymeric materials having different chain lengths, terminal end groups, side chains, and co-polymeric chains that introduce the desired properties into the conductive inks. In some cases, these polymers enhance the dispersion action of the dispersant. Modifiers and additives may also be used to enhance ink shelf life stability, final cured resistivity, and coating appearance.

Properties such as dispersion, ink rheology, adhesion, and coating quality may be selectively enhanced by certain modifiers and additives. For example, dispersion stabilizing agents (such as DISPERBYK® 111, 110, 180, and 190), anti-settling agents (such as BYK®-410 and 420), or any combination thereof may be added to conductive inks to enhance the ink shelf life stability and ink-jet-ability. In addition, ink rheology may be improved by rheology-modifying polymers (such as BYK®-410 and 420), by increasing the vehicle viscosity with addition of higher viscosity solvents (such as isobutyl alcohol, terpineol, glycerol, and the like), or any combination thereof. Adhesion enhancement may be achieved by adding adhesion promoters, such as styrene maleic anhydride copolymers (such as SMA® 1440H Solution and SMA® 1440 Flake), linear alkyl ethers (such as COLA® CAP MA259 and COLA® CAP MA610), quaternized alkyl imidazolines (such as COLA® SOLV IES and COLA® SOLV TES), and the like, into ink formulations. IES (or isostearyl ethylimidazolinium ethosulfate) is a biodegradable ionic liquid that reduces the static charge on metallic surfaces and improves adhesion of conductive inks.

Ink coating appearance or quality, as determined by coating uniformity and the absence of holes, may be improved by modifiers or additives that reduce ink surface tension, enhance metal wettability, promote ink defoaming, and the like. Surface tension modifiers such as, for example, BYK®-DYNWET800, BYK®-381, BYK®-346, and BYK®-378 (available from BYK Chemie), may be added into an ink formulation to reduce ink surface tension and improve metal wettability. Defoaming agents such as, for example, BYK®-066N, BYK®-141, BYK®-052, BYK®-067A, BYK®-1752, BYK®-080A, and BYK®-020 (available from BYK Chemie) may be used to reduce ink coating pinholes.

Some of the modifiers and additives noted above are listed in Table 1.

TABLE 1

Properties of additives used in conductive ink formulations

| Product Name | Manufacturer | Function | Chemical Description |
| --- | --- | --- | --- |
| MA026 | Colonial Chemical, Inc. | Non-ionic surfactant | |
| MA257 | Colonial Chemical, Inc. | Non-ionic surfactant | |
| MA259 | Colonial Chemical, Inc | Non-ionic surfactant | |

TABLE 1-continued

Properties of additives used in conductive ink formulations

| Product Name | Manufacturer | Function | Chemical Description |
|---|---|---|---|
| MA1610 | Colonial Chemical, Inc | Non-ionic surfactant | Alkoxylated alkene |
| COLA ® SOLV IES | Colonial Chemical, Inc | Foam stabilizer | Isostearyl ethylimidazolium ethosulfate |
| COLA ® SOLV TES | Colonial Chemical, Inc | Foam stabilizer | Oleyl ethylimidazolium ethosulfate |
| SMA ® 1440H | Elf Atochem | Surfactant and dispersant | Styrene-maleic anhydride copolymer |
| SMA ® 2625 | Elf Atochem | Surfactant | Styrene-maleic anhydride copolymer |
| SMA ® 3000 | Elf Atochem | Dispersant | Styrene-maleic anhydride copolymer |
| SMA ® 17325 | Elf Atochem | Surfactant | Styrene-maleic anhydride copolymer |
| RICOBOND ® 1731 | Elf Atochem | Adhesion promoter | Polybutadiene resin |
| RICOBOND ® 1756 | Elf Atochem | Adhesion promoter | Polybutadiene with maleic anhydride |
| BYK ®-020 | BYK ® Chemie | Defoamer | |
| BYK ®-052 | BYK ® Chemie | Silicone-free defoamer | |
| BYK ®-066N | BYK ® Chemie | Silicone defoamer | |
| BYK ®-067A | BYK ® Chemie | Defoamer | |
| BYK ®-080A | BYK ® Chemie | Silicone defoamer | |
| BYK ®-110 | BYK ® Chemie | Wetting and dispersing | |
| BYK ®-141 | BYK ® Chemie | Defoamer | |
| BYK ®-180 | BYK ® Chemie | Wetting & dispersing | Alkylolammonium salt of copolymer |
| BYK ®-182 | BYK ® Chemie | Wetting & dispersing | Block copolymer |
| BYK ®-190 | BYK ® Chemie | Wetting & dispersing | Block copolymer |
| BYK ®-191 | BYK ® Chemie | Wetting & dispersing | Copolymer |
| BYK ®-192 | BYK ® Chemie | Wetting & dispersing | Copolymer |
| BYK ®-194 | BYK ® Chemie | Wetting & dispersing | Copolymer |
| BYK ®-346 | BYK ® Chemie | Silicone surfactant | |
| BYK ®-378 | BYK ® Chemie | Surface tension reducer | |
| BYK ®-381 | BYK ® Chemie | Leveler | |
| BYK ®-410 | BYK ® Chemie | Rheological additive | |
| BYK ®-420 | BYK ® Chemie | Rheological additive | |
| BYK ®-DYN WET800 | BYK ® Chemie | Silicone free additive | Alcohol alkoxylates |
| BYK ®-1752 | BYK ® Chemie | Defoamer | |

Figure 5:
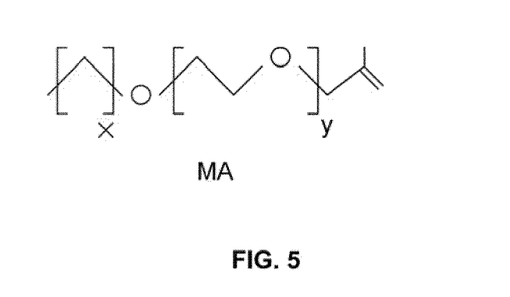
FIG. 5 illustrates the chemical structure of selected non-ionic surfactants.

The compounds MA026, MA257, MA259, and MA1610 are non-ionic surfactants available from Colonial Chemical, Inc. with the structure $H_3C-(CH_2)_x-O-(CH_2CH_2O)_y-CH_2C(CH_3)=CH_2$ (see FIG. 5). These compounds share a common structure but differ in cloud points, foam heights, and Draves Wetting. MA1610 has the shortest wetting time in the group, with a Draves Wetting (0.1% active) value of 6.0 seconds at 25° C. As an additive to conductive inks (e.g., copper inks), a low concentration of MA1610 (for example, about 0.1 wt % to about 0.2 wt %) gives a desirably low resistivity in the resulting conductive film as well as highly uniform coatings on KAPTON® substrates.

BYK®-378, a polyether modified polydimethylsiloxane with the structure $[O-Si(CH_3)_2]_n$, is a surface-tension-reducing agent that causes slip without support foam. This material, compatible with both organic-solvent-based and water-based inks, may be used in an amount ranging from about 0.01 wt % to about 0.3 wt % to limit cratering and increase ink-substrate wetting.

Figure 6:
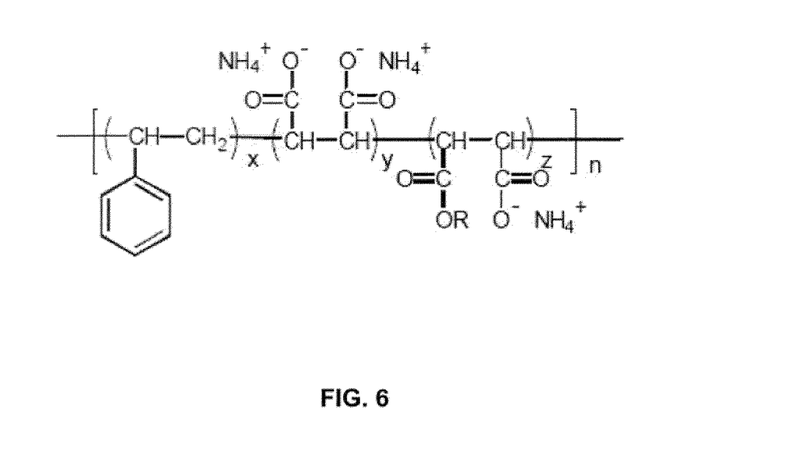
FIG. 6 illustrates the chemical structure of a pigment wetting agent obtained by hydrolysis of a styrene-maleic anhydride copolymer resin.

SMA® 1440H Solution (SMA), $-[(CH(Ph)-CH_2)-CH(CO_2H)-CH(CONHCH_3)_n]-$, shown in FIG. 6, is a pigment wetting agent (molecular weight 5,000 Daltons) obtained by the hydrolysis of a styrene-maleic anhydride copolymer resin.

BYK®-349 is a water-based, water-soluble additive that decreases the surface tension of water-based inks and promotes penetration and absorption of the ink into the substrate. This silicone surfactant provides a reduction in surface tension that leads to substrate wetting and leveling. In water, a surface tension of about 23 mN/m may be achieved at a dosage of 0.05 wt % BYK®-349. Similarly, this surface tension modifier may be used in very low concentrations to alter the properties of inks.

BYK®-DYNWET 800 is an alcohol alkoxylate that provides excellent reduction of the dynamic surface tension and thus improves substrate wetting as well. It is a silicone-free surface additive for aqueous systems. Depending on the formulation, a dosage of about 1 wt % to about 2 wt % has been shown to improve flow on a variety of substrates.

BYK®-381 for Inks is an ionic solution of a polyacrylic copolymer acrylic leveling additive that has little or no impact on surface tension. Added in a range of about 0.1 wt % to about 1 wt % of the total formulation, BYK®-381 improves the flow of coatings and also increases gloss, reducing surface defects such as craters and pinholes.

BYK®-346 for Inks, a solution of a polyether modified dimethylpolysiloxane, reduces the surface tension in aqueous printing inks, improving substrate wetting and leveling without foam stabilization. This silicone surfactant does not substantially increase surface slip or impair recoatability. If higher surface slip is desirable, BYK®-307, BYK®-333, or any combination thereof may be used together with BYK®-346. BYK®-346 imparts desirable properties to conductive inks in a range of about 0.1 wt % to about 1 wt % of the total formulation, and exhibits a desirable impact on systems with about 3 wt % to about 7 wt % co-solvent, based on the total formulation. If higher levels of co-solvents are present, polymeric silicone additives such as BYK®-307 and BYK®-333 may be used in place of BYK®-346. If the co-solvent content is lower, BYK®-348 may be used in place of BYK®-346. The solvent-free version of BYK®-346 is available as BYK®-345.

BYK®-410 and 420 may be used as stabilizing agents in metallic inks and pastes to enable long-term dispersion stability in formulations in which the difference in density between metallic particles and the liquid medium would otherwise result in phase separation. Stabilizing agents are weakly gel forming polymers where upon quiescent storage or very low shear they become semi-solid, thus inhibiting aggregation and sedimentation of particles suspended within. Upon shearing such a system beyond a yield stress, it becomes liquid and thus flows easily.

In metallic inks and pastes, stabilizing agents may be added in small quantities to avoid significant increases in the resistivity of conductors cured from these materials. In one example, an organogel was prepared by adding BYK®-410 to a organic-solvent-based copper nanoparticle ink. The resistivity of this ink was compared to an analogous ink that did not contain BYK®-410 by draw-down printing a film of each ink and measuring the resistivity by four-point probe. It was found that 0.2 wt % BYK®-410 was sufficient to inhibit phase separation in the ink without significantly increasing resistivity (i.e., resistivity increased from 7 μΩ·cm without BYK®-410 to 9 μΩ·cm with BYK®-410). Analogous systems have been developed in aqueous media with the aqueous stabilizing agent BYK®-420. For the water-based ink, the final film resistivity increased from 3.3 μΩ·cm without BYK®-420 to 8 μΩ·cm with BYK®-420.

EXAMPLES

The following examples are provided to more fully illustrate some of the embodiments of the present invention. It should be appreciated by those of skill in the art that the techniques disclosed in the examples that follow represent techniques discovered by the inventors to function well in the practice of the invention, and thus may be considered to constitute exemplary modes for its practice. However, those of skill in the art should, in light of the present disclosure, appreciate that many changes may be made in the specific embodiments that are disclosed and still obtain a like or similar result without departing from the spirit and scope of the invention.

Figure 9:
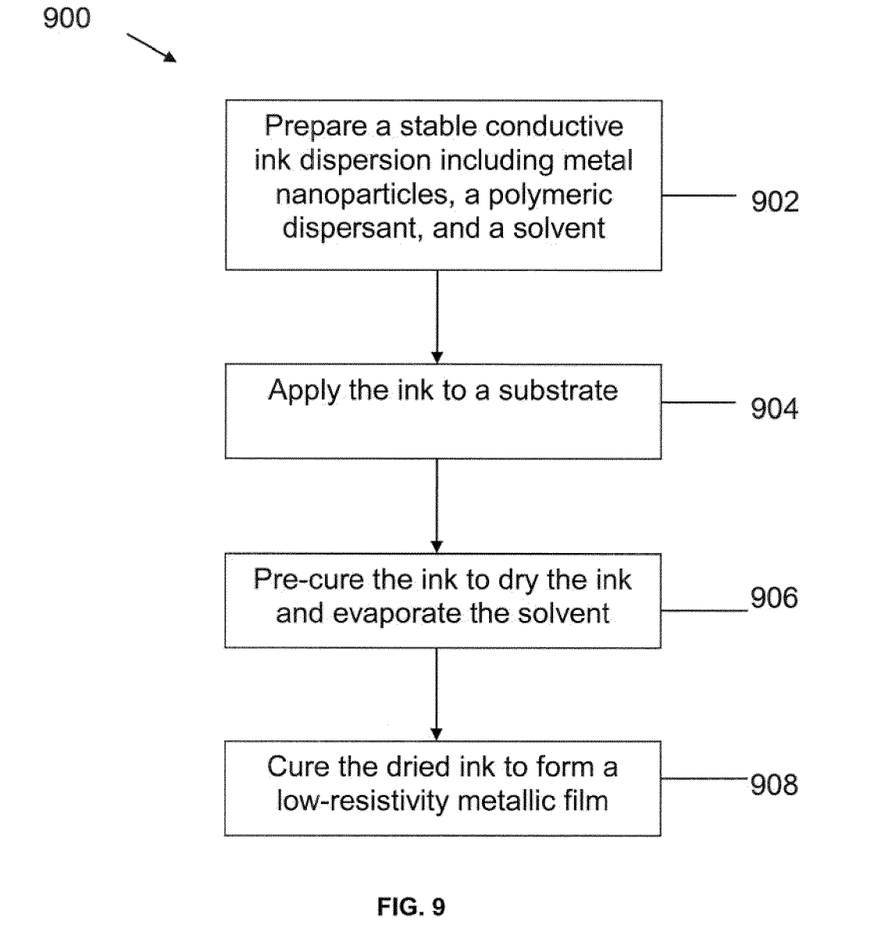
FIG. 9 is a flow chart illustrating steps in a process of forming metallic film from metallic ink.

FIG. 9. is a flow chart 900 illustrating steps in a process to form a metallic film from a metallic ink. Some or all of these steps are described in detail in the examples below. In step 902, a stable conductive ink dispersion including metal nanoparticles, a polymeric dispersant, and a solvent is prepared. In step 904, the ink is applied to a substrate. In step 906, the ink is pre-cured. In step 908, the ink is cured to form a conductive metallic ink.

Example 1

BYK®-378 was added to an ink solvent mixture (DT) including 2-butoxyethyl acetate (D) and propylene glycol monomethyl ether acetate (T). As shown in Table 2 below, the solvent surface tension decreased by about 2 mN/M from 29 mN/m without BYK®-378 to about 26.78 mN/m with 1~2 wt % BYK®-378. A reduced solvent surface tension of about 26~27 mN/m was shown to substantially eliminate pin holes in the resulting coating.

TABLE 2

Solvent surface tension reduction with BYK ®-378

| BYK ®-378 (wt %) | Surface Tension (mN/m) of DT-BYK ®-378 |
|---|---|
| 0 | 29 |
| 0~0.5 | 27.72 |
| 0.5~1 | 26.3 |
| 1~2 | 26.78 |

Example 2

Styrene maleic anhydride copolymer SMA® 1440 and its hydrolyzed water soluble derivative SMA® 1440H Solution were added to the solvent described in Example 1 (DT) along with 17 wt % copper loading. As seen in Tables 3 and 4, based on a scale of 1 (poor adhesion) to 10 (excellent adhesion), both SMA® 1440 and SMA® 1440H increased the coating adhesion of uncured copper film to KAPTON® substrate.

TABLE 3

Effect of SMA ® 1440 on coating adhesion

| SMA ® 1440 (wt %) in DT solvent with 17 wt % Copper Loading | Coating adhesion of uncured copper film to KAPTON ® substrate (score of 1-10) |
|---|---|
| 0 | 1 |
| 0~0.5 | 2 |
| 0.5~1 | 5 |
| 1~2.5 | 10 |
| 2.5~10 | 10 |

TABLE 4

Effect of SMA ® 1440H on coating adhesion

| SMA ® 1440H (wt %) in water/ethanol with 17 wt % Copper Loading | Coating adhesion of cured copper film to KAPTON ® substrate (score of 1-10) |
|---|---|
| 0 | 1 |
| 0~1.25 | 3 |
| 1.25~2.5 | 4 |
| 2.5~5 | 5 |

Additional experiments indicated that SMA® 1440 and SMA® 1440H may also serve as adhesion promoters for cured copper films. A dosage of 0.1~15 wt %. SMA® 1440 and SMA® 1440H is effective to achieve the desired improvement in adhesion for both cured and uncured copper films.

Example 3

As seen in Table 5, addition of 0.1~0.5 wt % COLA®SOLV IES to a mixture of SMA® 1440H, BYK®-DYNWET 800, and the conducting polythiophene (PT) (shown as the orange form in FIG. 3) improves the adhesion of a water-based copper ink to a KAPTON® substrate with a slight reduction in resistivity.

TABLE 5

Effect of additives on coating adhesion and resistivity

| SMA ® 1440H (wt %) | BYK ®-DYNWET 800 (wt %) | COLA ® SOLV IES (wt %) | PT (wt %) | Adhesion score on KAPTON ® (1-10) | Resistivity (μΩ · cm) |
|---|---|---|---|---|---|
| 1~5 | 1~5 | 0 | 0 | 3 | 11 |
| 1~5 | 1~5 | 0 | 0.1~0.5 | 5 | 7 |
| 1~5 | 1~5 | 0.1~0.5 | 0.1~0.5 | 10 | 6.45 |

Example 4

A mixture of copper wetting promoter MA1610, surface tension modifier BYK®-378, and film adhesion modifier COLA®SOLV IES was added to a conductive copper ink formulation. As shown in Table 6 below, the additives improved coating uniformity, adhesion to a KAPTON® substrate, and copper film resistivity.

TABLE 6

Effect of additives on coating adhesion and resistivity.

| MA1610 (wt %) | BYK ®-378 (wt %) | COLA ® SOLV IES (wt %) | Pre-sintering coating score on KAPTON ® (1-9) | Adhesion score on KAPTON ®(1-10) | Resistivity (μΩ · cm) |
|---|---|---|---|---|---|
| 0 | 0 | 0 | 7 | 9 | 7 |
| 0.01~1 | 0.01~0.5 | 0.01~1 | 9 | 10 | 2.68 |

Examples 5A-5F

The following water-based copper inks were formulated.

Example 5A

A water-based ink including copper nanoparticles and a conducting polymer dispersion of PEDOT:PSS (shown in FIG. 2), available from H. C. Starck, was prepared. The neutralized form of this acidic polymer is referred to as HCS—N. HCS and HCS—N are available as suspensions in aqueous ethanol. Copper nanoparticles were added to HCS/HCS—N to yield a suspension within a suspension.

Example 5B

A water-based ink including copper nanoparticles and a solution of a conducting polymer PT (shown in Example 3) was prepared. The PT was dissolved in aqueous alcohol, and copper nanoparticles were added to alcohol/PT solution to form a dispersion.

Example 5C

A water-based ink including copper nanoparticles and a solution including PT (shown in Example 3) and BYK® wetting agents and surface tension modifiers was prepared.

Example 5D

A water-based ink including copper nanoparticles and SMA® 1440H dispersant was prepared.

Example 5E

A water-based inks including copper nanoparticles, SMA® 1440H dispersant, a BYK® wetting agent, and an adhesion promoter, COLA® SOLV IES, was prepared.

Example 5F

A water-based ink including copper nanoparticles and glyoxylic acid or oxalic acid was prepared.

Each of these inks was coated on polyimide (KAPTON®). The coating was pre-cured and photosintered. The dispersion-quality was evaluated under centrifugation conditions. Other additives, including BYK®-349, BYK®-DYNWET800, isostearyl ethylimidazolinium ethosulfate and alcohols were added to some of these inks to promote good wetting properties and adhesion properties. For each of these inks, resistivity of the final metallic film was a range of about 5 to about 50 μΩ·cm range. Resistivities below 10 μΩ·cm were obtained for films formed from water-based copper inks including combinations of HCS, HCSN, SMA, PT, BYK®-349 and BYK®-DYNWET800. Resistivities below 20 μΩ·cm were obtained for films formed from water-based copper inks including glyoxylic acid. Resistivities below 200 μΩ·cm were obtained for films formed from water-based copper inks including oxalic acid and polyvinylpyrrolidone.

The following observations were noted:

1. The HCS conducting polymer suspension with copper nanoparticles (Example 5A) yielded a film with a resistivity of 4.5 μΩ·cm.

2. The HCSN conducting polymer suspension with copper nanoparticles (Example 5A) yielded a film with a resistivity of 13 μΩ·cm.

3. An aqueous isopropanol solution of PT with copper nanoparticles (Example 5B) yielded a film with a resistivity of 6 μΩ·cm.

4. An aqueous solution of glyoxylic acid with copper nanoparticles (Example 5C) yielded a film with a resistivity of 17 μΩ·cm.

5. An aqueous solution of glyoxylic acid and oxalic acid with copper nanoparticles (Example 5C) yielded a film with a resistivity of 135 μΩ·cm.

6. An aqueous solution of glyoxylic acid with polyvinylpyrrolidone (PVP) with copper nanoparticles yielded a film with a resistivity of 53 μΩ·cm.

7. An aqueous ethanol ink dispersion with added BYK®-D800 deteriorated as the percentage of SMA® 1440H was increased from 1.25 wt % to 5 wt. %.

8. The addition of 0.2 wt % PT to item 7 with 1.25 wt % SMA® 1440H improved the dispersion. Reducing the quantity of SMA® 1440H to 0.5 wt % in this formulation resulted in deterioration of the dispersion.

9. No change in dispersion quality was observed when the amount of SMA® 1440H in items 7 and 8 was increased to 2.5 wt % and then to 5 wt % in items 7 and 8.

10. The resistivity decreased from 19 to 8 μΩ·cm with no loss of adhesion when 0.2 wt % PT was added to the aqueous ink with BYK®-DYNWET800 and SMA® 1440H.

11. All of these inks, except for the ink with 5% of SMA® 1440H in item 7, yielded films with good adhesion and resistivity.

12. The addition of IES resulted in water-based inks with excellent adhesion to polyimide (KAPTON®) and a low resistivity of 6.5 μΩ·cm.

Example 6

A mixture of water and alcohol was used as a vehicle for formulating copper inks. The water content ranged from about 50 wt % to about 80 wt %. The alcohol content ranged from about 10 wt % to about 50 wt %. Alcohols including isopropanol (IPA), isobutyl alcohol, ethanol, polyvinyl alcohol, ethylene glycol, and combinations thereof were used. Amines, polyvinylpyrrolidone (PVP), polyethylene glycol, isostearyl ethylimidazoliniurn ethosulfate, and oleyl ethylimidazolinium ethosulfate were used as dispersants. Copper nanoparticles, with a loading concentration of from about 15 wt % to about 65 wt %, were formulated with vehicles and dispersants.

In one particular example, water, IPA, and PVP were mixed with copper nanoparticles to form a copper ink. The ink was coated on a polyimide substrate to form a film. The film was photosintered to yield copper conductors. A copper ink with a $H_2O$/IPA vehicle system and DISPERBYK®-111 as the dispersant yielded a film with a resistivity of 4.85 μΩ·cm. A weight ratio of IPA:$H_2O$ of 2:1 to 3:1 was desirable with the addition of adhesion promoter additives, such as COLA®SOLV IES and SMA® 1440H to the $H_2O$/IPA vehicle system.

Example 7

A mixture of cyclohexanol/IPA/$H_2O$ was prepared for use as a vehicle for a copper ink formulation. Preferred compositions included a water content of about 10 wt % to about 50 wt %, a cyclohexanol content of about 40 wt % to about 60 wt %, and a ratio of $H_2O$:IPA of about 1:1 to about 1:2. A resistivity of 8 μΩ·cm was achieved for a copper ink with a copper nanoparticle loading of about 10 wt % to about to 15 wt %, with a cyclohexanol/$H_2O$/IPA vehicle and a dispersant selected from phosphoric acid modified phosphate polyester copolymers DISPERBYK®-11, DISPERBYK®-190, DISPERBYK®-194, the sulfonated styrene maleic anhydride ester SMA® 1440H, or any combination thereof.

Example 8

A mixture of isobutanol/IPA/$H_2O$ was prepared for use as a vehicle for a copper ink formulation. Preferred compositions included a water content of about 10 wt % to about 30 wt %, a isobutanol content of about 20 wt % to about 80 wt %, and a ratio of $H_2O$:IPA of about 1:1 to about 1:2. A resistivity of 20 μΩ·cm was achieved for a copper ink with a copper nanoparticle loading of about 10 wt % to about to 15 wt %, with a isobutanol/$H_2O$/IPA vehicle and a dispersant selected from phosphoric acid modified phosphate polyester copolymers DISPERBYK®-111, DISPERBYK®-190, DISPERBYK®-194, COLA® SOLV IES, the sulfonated styrene maleic anhydride ester SMA® 1440H, or any combination thereof.

Example 9

A dispersion of about 2 wt % 3,4-polyethylenedioxythiophlene-polystyrene-sulfonate (PEDOT:PSS) in a mixture of 60~80 wt % water and 10~30 wt % ethanol (available from H. C. Starck Inc.) was obtained. The dispersion also included 1-5 wt % dimethyl sulfoxide and 1-5 wt % oxy-bis-ethanol. Copper nanoparticles, with a size ranging from about 2 nm to about 100 nm, were added to this dispersion in a glove box to form a dispersion with about 15 wt % to about 65 wt % copper. The solution was agitated for at least 20 minutes to break up any agglomerated copper nanoparticles and to mix the dispersion. A stable dispersion, or copper ink, was obtained after agitation.

Copper films were deposited by the draw-down process onto a flexible polyimide substrate. Following this, a pre-cure process at 100° C. in air was employed to evaporate the water and solvents from the deposited film. The pre-cure step required at least 15 minutes to ensure that the water and solvents were removed, and that the resulting material was dry.

An ink-jet printer was also used to print this copper ink onto a polyimide substrate. After ink-jet printing, a pre-cure process of heating at 100° C. in air was carried out to evaporate the water and the solvents, and to ensure that the resulting printed material was dry.

Figure 7:
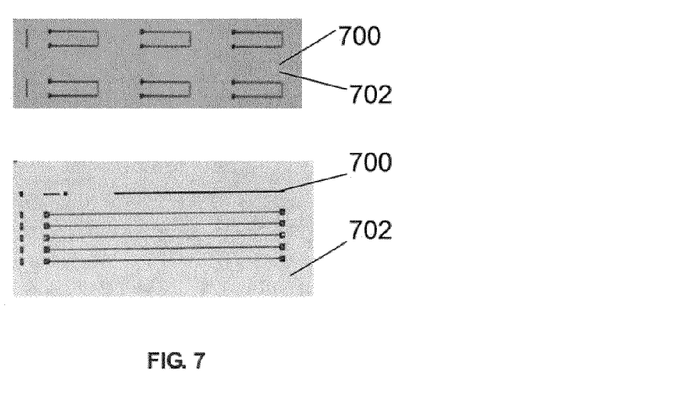
FIG. 7 illustrates ink-jet printed patterns from copper ink prepared with a conductive polymer.
Figure 8:
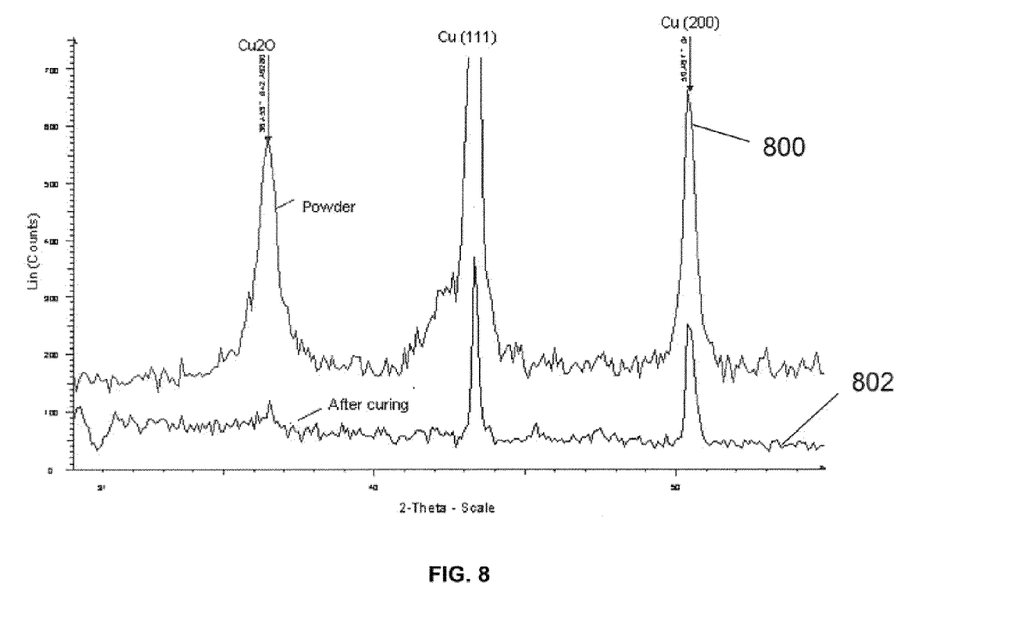
FIG. 8 illustrates X-ray diffraction patterns of copper oxides and copper nanoparticles in copper ink before and after photonic curing.

An optical flash system, employing a high-power pulsed xenon lamp able to deliver up to 15 J/cm$^2$ energy density with a pulse width of from 0.01 to 2000 μsec, was then used to cure the printed and dried copper inks. This optical curing step was carried out in air at room temperature. After this curing process a resistivity of $7 \times 10^{-6}$ Ω·cm was achieved with films printed by both draw-down and ink-jet printing methods. As shown in FIG. 7, which depicts patterns 700 printed with this copper ink on a polyimide substrate 702, the copper nanoparticles are fused during the very short curing time of the xenon flash, with little or no damage to the substrate. Any copper oxides that are present on the surface of the copper nanoparticles are at least partially photoreduced, as shown in the X-ray diffraction patterns in FIG. 8, which were taken on samples before 800 and after 802 the flash curing process with the xenon lamp.

Example 10

A 0.1 wt % to about 1 wt % dispersion of the conductive polymer PT was prepared in water. Copper nanoparticles, with a size ranging from about 2 nm to about 100 nm, were added to this dispersion in a glove box to form a dispersion with a range of about 15 wt % to about 65 wt % copper. The solution was agitated for about 20 minutes to break up any agglomerated copper nanoparticles and mix the dispersion. A stable dispersion, or copper ink, was obtained after agitation. Minimal settling of the copper nanoparticles was noted. Printing on a flexible substrate, followed by pre-curing and then curing in air with an optical flash system to form a copper conductor with a resistivity of $16 \times 10^{-6}$ μΩ·cm, thought to be due in part to the low concentration of the conductive polymer.

What is claimed is:

1. A conductive ink comprising:
about 15 wt % to about 65 wt % copper nanoparticles;
a vehicle comprising: about 10 wt % to about 50 wt % water;
    about 40 wt % to about 60 wt % cyclohexanol; and
    an amount of isopropanol such that a ratio of water to isopropanol is between about 1:1 and about 1:2; and
a dispersant.

2. A conductive ink comprising:
about 15 wt % to about 65 wt % copper nanoparticles;
a vehicle comprising: about 1.0 wt % to about 30 wt % water;
    about 20 wt % to about 80 wt % isobutanol; and
    an amount of isopropanol such that a ratio of water to isopropanol is between about 1:1 and about 1:2; and
a dispersant.

* * * * *